(12) United States Patent
Lapierre (10) Patent No.: US 7,103,114 B1
(45) Date of Patent: Sep. 5, 2006

(54) MODULATED RADIO SIGNAL TRANSMITTER WITH SELF-ADAPTED AMPLIFICATION POLARIZATION

(75) Inventor: Luc Lapierre, Toulouse (FR)

(73) Assignee: Centre National d'Etude Spatiales (C.N.E.S.), Paris (FR)

( * ) Notice: Subject to any disclaimer, the term of this patent is extended or adjusted under 35 U.S.C. 154(b) by 776 days.

(21) Appl. No.: 10/088,797

(22) PCT Filed: Sep. 22, 2000

(86) PCT No.: PCT/FR00/02628

§ 371 (c)(1),
(2), (4) Date: Mar. 22, 2002

(87) PCT Pub. No.: WO01/22572

PCT Pub. Date: Mar. 29, 2001

(30) Foreign Application Priority Data

Sep. 24, 1999 (FR) .................................. 99 11943

(51) Int. Cl.
*H04L 25/06* (2006.01)
(52) U.S. Cl. ............... 375/318; 375/297; 375/295; 375/319; 455/126; 455/127
(58) Field of Classification Search .......... 375/318, 375/319, 297, 295; 330/296, 133, 129, 295; 455/126, 127
See application file for complete search history.

(56) References Cited

U.S. PATENT DOCUMENTS

| | | | |
|---|---|---|---|
| 5,432,473 A * | 7/1995 | Mattila et al. ............... 330/133 |
| 5,608,762 A * | 3/1997 | Maddy ......................... 375/319 |
| 5,625,322 A * | 4/1997 | Gourgue et al. ............ 330/129 |
| 5,745,526 A | 4/1998 | Kumm et al. ................ 375/297 |
| 5,933,767 A | 8/1999 | Leizerovich et al. ......... 455/126 |
| 5,990,750 A * | 11/1999 | Katz ............................ 330/295 |
| 6,176,432 B1 * | 1/2001 | Miyaura ...................... 235/487 |
| 6,429,746 B1 * | 8/2002 | Koukkari ..................... 330/296 |

FOREIGN PATENT DOCUMENTS

EP          0 382 697 A2    8/1990

OTHER PUBLICATIONS

Gary Hanington et al., International Microwave Symposium, Baltimore, 1998 IEEE MTT-S Digest WE2C-6 p. 589-592 "Microwave Power Amplifier Efficiency Improvement With a 10 MHz HBT DC-DC Converter".

* cited by examiner

*Primary Examiner*—Chieh M. Fan
*Assistant Examiner*—Eva Zheng
(74) *Attorney, Agent, or Firm*—Young & Thompson (57) ABSTRACT

The invention relates to a transmitter of radio signals (SMS), which are amplitude-modulated according to a discrete plurality of amplitude levels, in which at least one output power transistor (6) receives, on one of its terminals, a bias-voltage level which is adapted to the amplitude level represented by the instantaneous value of a selection signal (SS) generated by analysis means (11) on the basis of the digital control signals (1). The electrical consumption is hence optimized.

19 Claims, 3 Drawing Sheets

MODULATED RADIO SIGNAL TRANSMITTER WITH SELF-ADAPTED AMPLIFICATION POLARIZATION

BACKGROUND OF THE INVENTION

The invention relates to a transmitter of radio signals, referred to as output modulated signals, which are modulated at least in amplitude according to a discrete plurality of predetermined separate amplitude levels on the basis of digital control signals, comprising, modulation means adapted to convert the digital control signals into modulated signals, referred to as input modulated signals, solid-state power amplification means including at least one power transistor, at least one of which is an output power transistor delivering output modulated signals, bias means including at least one voltage source, and adapted to bias each power transistor of the amplification means.

Transmitters of modulated radio signals have been known for a long time and can be extremely varied. The modulation may be phase and/or amplitude and/or frequency modulation. In the case of amplitude modulation, and also in the case of certain phase modulations, the modulated signals received at the input and those delivered at the output of the power amplification means have an amplitude which varies permanently in a discrete fashion, that is to say being able to take one of the values of a predetermined discrete plurality of separate amplitude levels.

For this reason, it is necessary to over-engineer the amplification means and to bias the power transistors with a large input offset in order to avoid saturation and make it possible to deliver the various output powers with good linearity. However, it is found that the efficiency of a power transistor varies, for a given bias, as the amplitude of the signals at the input and at the output of the transistor. Therefore, for the lowest signal amplitude levels, the efficiency of a transistor drops considerably. Moreover, such a drop in efficiency is highly detrimental in all applications in which the electrical energy source for supplying the transmitter is not inexhaustible, and is formed in particular by accumulators or cells, and more generally when this electrical energy is expensive.

In these applications, the use of modulation such as M-QAM amplitude modulation with M states has hitherto been discarded, in spite of the significant advantages which such modulation can provide (in particular a small spectral size for the same bit rate). Such is, in particular, the case on board space systems such as satellites, and more particularly micro-satellites, in which energy and cost economies as well as the problem of simplicity and speed of manufacture are crucial. Such is also the case with portable radio communication equipment.

This problem is generally encountered for each of the power transistors of the amplification means, but more particularly at least for the output power transistor(s), whose operation largely determines the overall electrical consumption of the transmitter. The reason is that, in the case of several amplification stages, the electrical consumption is known to be the greatest in the output stage delivering the output signals.

In order to overcome this problem, a technique referred to as envelope elimination/restoration EER has been proposed, in which the envelope of the modulated signals coming from the modulator is detected, the envelope of the modulated signals is eliminated with the aid of an amplitude limiter, the output power transistor is saturated with a high input power, a high-frequency PWM ("pulse width modulation") switching converter, which is driven according to the envelope detected previously, is used for the bias (the switching frequency needing to be much higher than that of the envelope of the modulated signals), so that the variation in the bias provided by this converter makes it possible to restore the envelope on the modulated signals at the output of the output power transistor. This technique is, however, limited by the switching-frequency values and is not therefore easy to apply at very high envelope frequencies, especially in the field of high-speed digital data transmissions (typically several megabits per second or tens of megabits per second between space systems—in particular satellites—and the earth). Furthermore, production of the envelope detector, the limiter and the converter is relatively complex—especially in the field of high-speed transmissions in which the modulated signals have a microwave carrier.

It should be noted, in particular, that when the complex envelope of a microwave signal passes through the value 0, the envelope of the real signal has a stationary point which, with this EER technique, induces an abrupt voltage variation with spectral components whose frequencies are extremely high. Furthermore, this EER technique demands excellent overall linearity of the system formed by the amplification means and the bias converter, throughout the dynamic range of the envelope of the signal.

Similarly, the document "MICROWAVE POWER AMPLIFIER EFFICIENCY IMPROVEMENT WITH A 10 MHz HBT DC-DC CONVERTER" Gary Hanington et al, International Microwave symposium, Baltimore, 1998 IEEE MTT-S Digest WE2C-6 pp. 589–592, teaches detecting the power of the input modulated signal of the amplifier with an RF coupler and an envelope detector, and driving the value of the bias voltage of the power amplification stage provided by a PWM switching converter. There again, this solution is frequency-limited (the modulated signals being able to have a variation spectrum not exceeding 2 MHz for a switching frequency between 10 and 20 MHz). It is furthermore relatively complex to produce, in particular when the modulated signals have a microwave carrier. This is because the circuits through which microwave signals travel are known to be complex, expensive and difficult to tune. It should furthermore be noted that any error or any noise incorporated in the input modulated signals is echoed in the converter and the bias of the power transistor. This solution therefore tends to amplify the errors and noises and has imprecise operation.

SUMMARY OF THE INVENTION

It is therefore an object of the invention to overcome all these drawbacks and to provide a transmitter as mentioned, and in which at least the output power transistor(s)—in particular all the power transistors—has (have) an efficiency which remains optimized, that is to say it is permanently the best possible, including for low amplitude levels of the input signals, and which is furthermore simple and inexpensive to produce and easy to apply in all carrier-frequency ranges of the signals—including in the microwave range—and in all the variation-frequency ranges of the signals—including for high-speed transmissions.

It is hence an object of the invention to permit the use of modulation such as amplitude modulation of the quadrature M-QAM type with M states, M being a power of 2, generating modulated signals at the input of the amplification means whose amplitude varies according to a discrete plurality of amplitude levels, without substantially compromising the electrical consumption of the transmitter compared with other types of modulation, in which the amplitude of the input modulated signals remains at least substantially constant, and to do so in a way which is simple, economical and applicable to all the frequency ranges, including microwave carriers and/or high-speed transmissions.

It is a particular object of the invention to provide such a transmitter which does not require the use of a PWM switching converter with a high switching frequency, and which does not in fact impose any particular constraint on the switching frequency or technique, nor even the use of such a technique, for biasing the power transistors.

It is also an object of the invention to provide such a transmitter in which the number of circuits through which the modulated signals travel, and which need to transmit the carrier or be compatible with its frequency, is also as small as possible. It is a particular object of the invention to minimize the number of microwave circuits of the transmitter.

It is also an object of the invention to provide such a transmitter whose operation is reliable and precise, that is to say providing an output modulated signal with an error-free amplitude level.

It is also an object of the invention to provide such a transmitter which is, in particular, adapted to space transmissions and which can advantageously be integrated on board a spacecraft such as an artificial satellite—especially a terrestrial micro-satellite—in a simple and economical way.

To that end, the invention relates to a transmitter as mentioned above, and wherein the bias means are adapted to be able to deliver, for at least one terminal to be biased in each output power transistor of the amplification means, a predetermined discrete plurality of separate bias-voltage levels, each bias-voltage level being associated with and adapted to at least one of said amplitude levels of the output modulated signals, which transmitter also comprises:

means, referred to as analysis means, adapted to generate in real time, on the basis of the instantaneous value of the digital control signals, a signal, referred to as a selection signal, whose instantaneous value is representative of the instantaneous amplitude level needing to be taken by the output modulated signals to be transmitted corresponding to this instantaneous value of the digital control signals, the instantaneous value of the selection signal varying with the digital control signals according to a discrete plurality of values corresponding to the various amplitude levels of the output modulated signals, switch means receiving the selection signal, and adapted to select and apply at each instant, to said terminal to be biased, a bias voltage that is delivered by the bias means and whose value is equal to the bias-voltage level associated with and adapted to the amplitude level represented by the instantaneous value of the selection signal.

The transmitter according to the invention can hence be produced in an extremely simple and economical way and, in particular, it does not require any complex and high-performance converter for biasing the power transistors. The transmitter according to the invention furthermore does not require any additional circuit through which the carrier travels or which is compatible with the frequency of the carrier—in particular no microwave circuit when the carrier signal is in the microwave range. This is because the transmitter according to the invention includes only means for analyzing the digital control signals, and switch means that are driven at the rate of the amplitude variations of the output modulated signals.

It should be noted, in particular, that the detection which takes place in order to adapt the bias voltage of each output power transistor, in real time, is not performed on the analog signals or at the level of the modulation known from the prior art, which would require relatively complex envelope detection. Instead, this detection is carried out by the analysis means on the basis of the instantaneous digital value of the digital control signals (baseband), by determining—in particular using a logic circuit—the amplitude level that the output modulated signals need to have in order to encode this digital value, according to the modulation carried out by the transmitter, the characteristics and logic of which are moreover known. Hence, even though the instantaneous value of the amplitude level is already determined by the transmission chain (modulation and digital/analog conversion, and power amplification), the invention does not use this determination (in contrast to the EER technique and the document described above) to generate the selection signal, but uses complementary specific analysis means which determine and/or calculate in parallel, in a logical fashion on the basis of the digital control signals (baseband), the amplitude level corresponding to these digital control signals.

The bias means, the analysis means and the switch means produce the means for real-time adaptation of the bias voltage delivered by the bias means for at least one terminal of each output power transistor of the power amplification means, according to the instantaneous value needing to be taken by the output modulated signals. Further, this adaptation is not carried out on the basis of the envelope of modulated signals coming from a modulation circuit, but on the basis of the control digital signals (baseband) to be transmitted. Much more precise and reliable adaptation is hence obtained, without an additional high-frequency circuit, and with simple and reliable bias means.

Since the amplification means is driven on the basis of the digital signals, the errors or noises due to modulation are not echoed in the operation of the power transistors, which is more reliable and precise.

What is more, in a transmitter according to the invention, the bias means delivering a discrete plurality of voltage levels (that is to say an integer number, greater than 1, of voltage levels) are simpler, more economical and more reliable than in the prior art, where it was necessary to use a PWM converter whose switching frequency and properties needed to be adapted to be able to provide a voltage capable of being continually variable. It should in fact be noted that the switching frequency, the characteristics and the performances of the bias means, which provide voltage levels that are always identical, are in no way affected by the amplitude variations of the modulated signals. Hence, although the invention involves a certain redundancy in determining the modulation amplitude levels, this redundancy does make the transmitter more complex and in fact, on the contrary, leads to great simplification and enhanced performances, including in the microwave range.

Advantageously, and according to the invention, the analysis means are formed by an electronic logic circuit adapted to determine said instantaneous amplitude level, on the basis of the instantaneous digital value of the digital control signals, and to generate the selection signal representative of this instantaneous amplitude level. This logic circuit is adapted, according to the modulation that is used, to determine the amplitude level of the output modulated signals corresponding to each bit sequence of the digital control signals. Simple and reliable combinatorial logic is therefore involved, the results of which do not depend on the errors and noises of the analog circuits or microwave circuits.

Advantageously, the invention relates to a transmitter as mentioned above, comprising a modulation circuit adapted to convert the digital control signals into analog signals that are modulated, at least in amplitude, according to a discrete plurality of predetermined separate amplitude levels, wherein the analysis means are adapted to generate and deliver, on the basis of the digital control signals, a selection signal whose instantaneous value is representative of an instantaneous amplitude level of the signals delivered by the modulation circuit.

In particular, the amplitude modulation may advantageously be carried out by a specific circuit that is separate from the power amplification means and the bias means.

As a variant, the amplitude modulation may be partially or entirely carried out by the power amplification transistors, by virtue of the variations in the bias voltages. In this case, the modulation circuit may carry out only phase modulation (referred to as "PSK"). The influence of the amplification means in the amplitude modulation depends on the connection of the power transistors, the operation class, and the way in which their various terminals are biased on the basis of the bias means.

For example, in order to avoid any effect of the bias variations of the power transistors on the amplitude of the output modulated signals, switch means may be used to simultaneously vary the bias voltages of two terminals of each transistor (for example the drain bias voltage and the gate bias voltage for a common-source field-effect transistor). This double variation may be obtained, at least in part, by an appropriate choice of the operation class of the transistor, for example in class B for a field-effect transistor. Conversely, if only one terminal has its bias voltage varied, the power transistor will most often (except in class B) entail amplitude modulation of the output modulated signals.

Advantageously, and according to the invention, the modulation means are means for quadrature amplitude modulation M-QAM with M states, M being a power of 2. It should be noted that the number of amplitude levels is not equal to the number of modulation states addressed in the complex plane. For example, for 16-QAM modulation, the modulated signals have only three amplitude levels.

Advantageously, and according to the invention, said discrete plurality of bias-voltage levels comprises an integer number N>1 of bias-voltage levels equal to the number of amplitude levels of said discrete plurality of amplitude levels of the output modulated signals, each bias-voltage level being associated with and adapted to one and only one amplitude level. As a variant, a given bias-voltage level may be associated with and adapted to several amplitude levels, for example if the amplitude levels can be grouped as several groups of neighboring levels.

Advantageously, and according to the invention, each bias-voltage level is adapted so that the efficiency of each output power transistor, biased with this bias-voltage level, is optimal for the amplitude level of the output modulated signals SMS that it delivers. Particularly advantageously, and according to the invention, each bias-voltage level is adapted so that each output power transistor, biased with this bias-voltage level, delivers an output power which is of the order of its saturation-onset power for the level of the output modulated signals that it delivers. A transmitter according to the invention is advantageously one wherein each output power transistor of the amplification means is a field-effect transistor receiving input modulated signals on its gate and delivering the output modulated signals on its drain, wherein the bias means are adapted to be able to deliver a discrete plurality of drain bias-voltage levels VD, and wherein the switch means are adapted to drive the value of the drain bias voltage VD of each output power transistor according to the value of the selection signal.

Furthermore, advantageously and according to the invention, the bias means are also adapted to be able to deliver a discrete plurality of gate bias-voltage levels VG, and wherein the switch means are adapted to drive the value of the gate bias voltage VG of each output power transistor according to the value of the selection signal. In this way, the amplitude gain of the transistor can be kept at least substantially constant in spite of the bias-voltage variations of the drain. This is because the gate bias voltage VG is known to make it possible to drive the average strength of the current in the drain. As a variant, the same effect may be obtained, at least in part, automatically on the basis of the input modulated signals, if the power transistor is placed in an operation class which permits such self-adaptation of the gain, for example in class B. In any event, the invention makes it possible to obtain a variation of the drain bias voltage, and of the average current strength in the drain, allowing the optimum efficiency to be obtained for each amplitude level, including the lowest levels.

In the case when the amplification means comprise several power transistors, advantageously and according to the invention the switch means are adapted to drive the bias-voltage value of at least one terminal of predetermined nature (identical for all the transistors connected in a similar way) of each transistor according to the value of the selection signal. For example, the drain bias voltage of all the transistors connected in common-source mode is driven.

Likewise, if the amplification means include several stages, advantageously and according to the invention each power transistor of each stage is driven by a selection signal. However, it is known that the efficiency of the transmitter depends above all on that of the output stage. As a variant according to the invention, the switch means may also be adapted to drive only each power transistor of the output stage of the amplification means.

Such a transmitter has many possible applications, and may be adapted to numerous frequency bands. It may nevertheless advantageously be adapted to transmit signals that have a carrier in the microwave range and are capable of transmitting digital data with a rate of between 1 Mbit/s and 100 Mbit/s.

The invention also relates to a transmitter having all or some of the features mentioned above or below in combination.

BRIEF DESCRIPTION OF THE DRAWINGS

Other objects, features and advantages of the invention will become apparent from the following description that refers to the appended figures, which illustrate an exemplary embodiment and in which.

DESCRIPTION OF THE PREFERRED EMBODIMENTS

Figure 1:
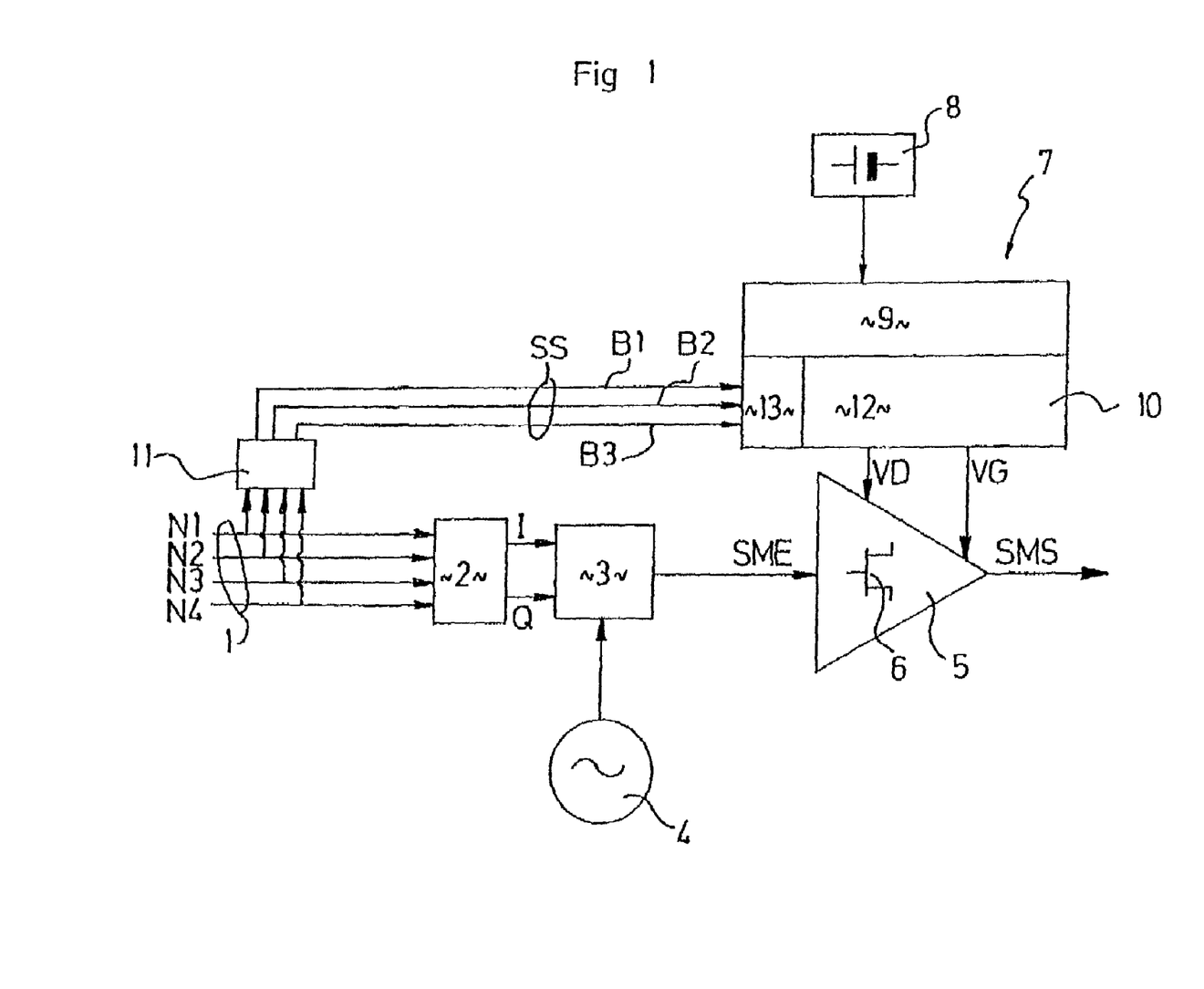
FIG. 1 is a general schematic representation of a transmitter according to the invention.

The transmitter according to the invention schematically represented in FIG. 1 receives digital data to be transmitted, referred to as digital control signals 1, which comprise four bits N1, N2, N3, N4 in the example that is represented. The digital control signals 1 are supplied to a digital/analog converter 2 which delivers two analog signals I, Q in quadrature, which are in turn supplied to a modulator circuit 3 whose output delivers signals, referred to as input modulated signals SME, modulated on a carrier delivered by an oscillator 4 to the modulator circuit 3.

The input modulated signals SME are supplied to a power amplifier 5 comprising at least one power transistor 6, at least one of which is an output power transistor that delivers output modulated signals SMS supplied to a transmission antenna (not shown).

Each power transistor 6 of the amplification means 5 is biased by bias means 7 providing the drain bias voltages VD and gate bias voltages VG of the field-effect power transistors 6. These bias means 7 comprise a DC voltage source 8, which is for example the unregulated rail on board a satellite, or a battery of accumulators or cells, PWM switching converter means 9 adapted to be able to deliver a predetermined discrete plurality of separate bias-voltage levels for the drain bias voltage and/or for the gate bias voltage, and switch means 10 adapted to apply at each instant, to each of the terminals to be biased, a bias voltage coming from the converter means 9. A logic-analysis circuit 11 collects the digital control signals 1, and is adapted to generate in real time, on the basis of the instantaneous value of the digital control signals, a selection signal SS whose instantaneous value is representative of the instantaneous amplitude level needing to be taken by the output modulated signals SMS to be transmitted corresponding to this instantaneous value of the digital control signals 1.

Figure 2:
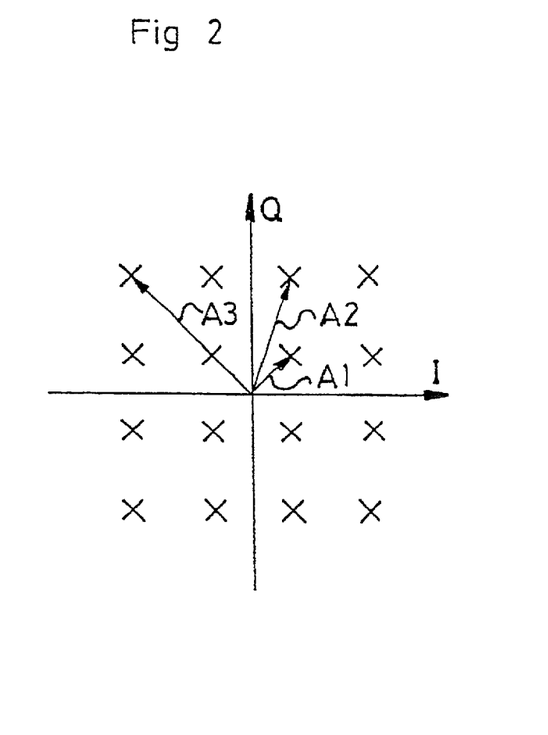
FIG. 2 is a diagram illustrating an example of a constellation in the complex plane corresponding to amplitude modulation with 16 states.

In the example of FIG. 2, the modulator circuit 3 is a modulator, referred to as 16 QAM, producing amplitude modulation with 16 states. As can be seen in FIG. 2, the amplitude of the signal can in fact take three separate values A1, A2, A3. Hence, according to the value taken by the four bits N1, N2, N3, N4 of the digital control signals 1, and according to the values of the signals I and Q coming from the converter 2, a logic approach can be used to determine which amplitude level A1, A2, A3 will need to be taken by the output modulated signals SMS. This combinatorial logic calculation is carried out by the analysis logic circuit 11, which delivers a selection signal SS formed by three control bits B1, B2, B3 corresponding respectively to each of the amplitude levels A1, A2, A3. At each instant, a single one of the control bits B1, B2, B3 is equal to 1, so that the selection signal SS is representative of the amplitude level A1, A2, A3 of the output modulated signals SMS. This selection signal SS is supplied to the switch means 10.

Figure 4:
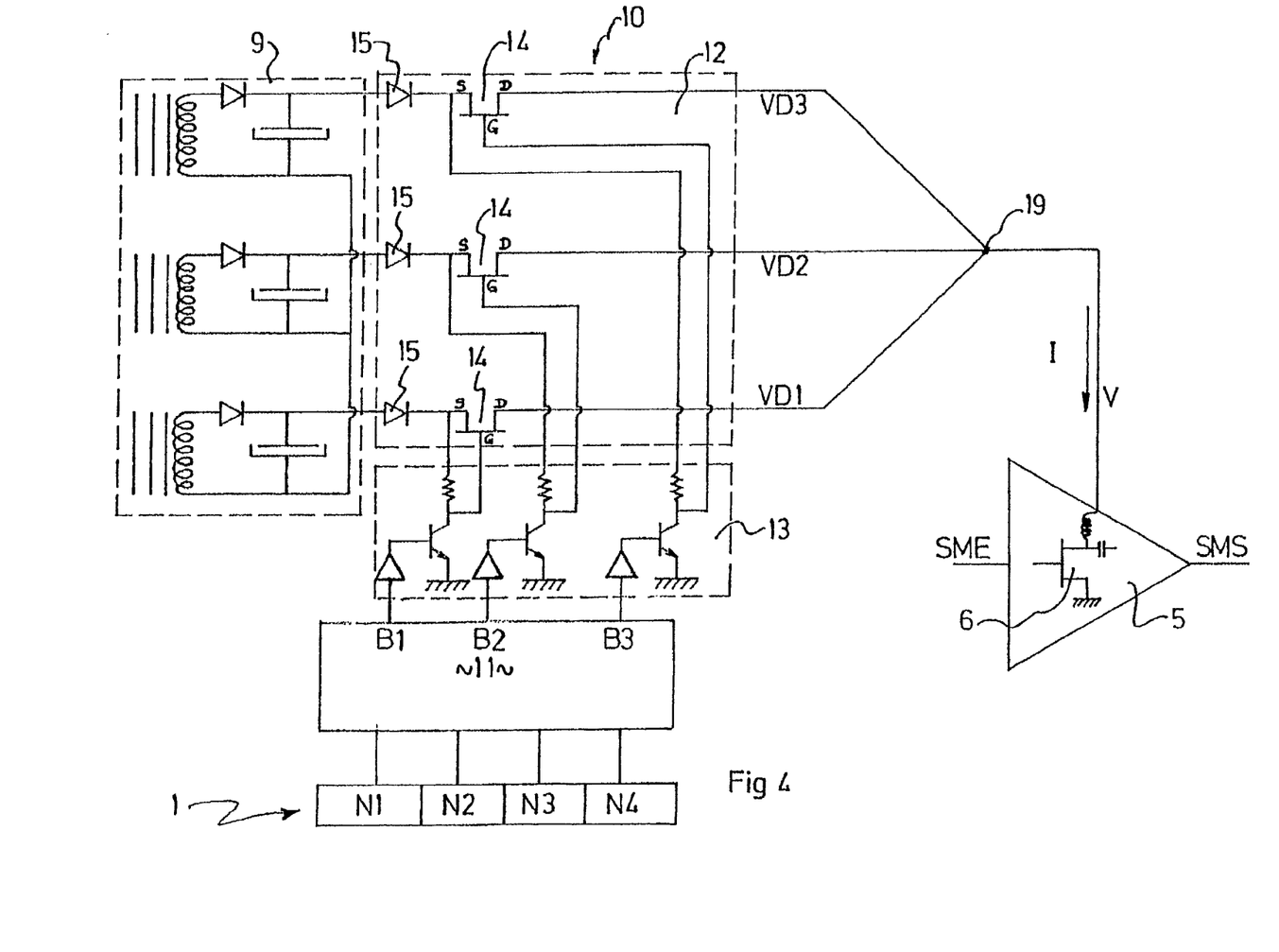
FIG. 4 is a schematic representation of an exemplary embodiment of a transmitter according to the invention.

FIG. 4 represents in more detail the circuit for delivering the drain bias voltage VD to the amplification means 5. The converter means 9 are adapted to provide three separate drain bias voltages VD1, VD2, VD3, which are regulated by the converter means and respectively correspond to the amplitude levels A1, A2, A3 of the output modulated signals SMS. The value of these bias voltages can be determined in order to adapt the operation of the power transistor 6 so that the latter has the best efficiency, according to the input power Pe which it receives on its gate. In this embodiment, the input modulated signals are amplitude-modulated by the modulator circuit 3, and therefore also have three separate amplitude levels corresponding to the three amplitude levels A1, A2, A3 of the output modulated signals SMS.

Figure 3:
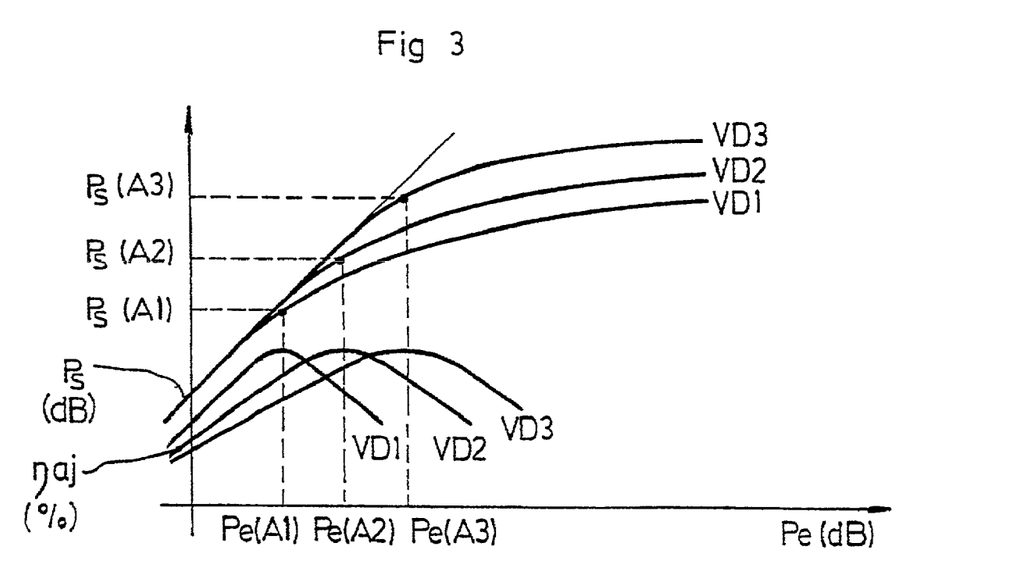
FIG. 3 is a diagram illustrating the variations in the curves of output power and of added efficiency according to the drain bias voltage VD of a field-effect power transistor connected in common-source mode.

FIG. 3 represents the various curves representative of the output power Ps as a function of the input power Pe of a field-effect output power transistor, according to the various bias voltages VD1, VD2, VD3. Beyond a certain value of the input power, the power transistor exhibits a saturation phenomenon. FIG. 3 also represents the curves illustrating the variations in the added efficiency $\eta aj$ of the power transistor as a function of the input power Pe. As can be seen, when the drain bias voltage VD varies, the added efficiency $\eta aj$ does not vary in terms of maximum value, but becomes shifted, the maximum in its efficiency always being situated close to the saturation onset of the transistor. The added efficiency $\eta aj$ of the transistor, which is the efficiency criterion used in the microwave field, is given by the formula:

$$\eta aj = \frac{Ps - Pe}{Palim},$$

where Palim represents the supply power on the drain, that is to say it is equal to the product of the drain bias voltage VD multiplied by the corresponding current ID. The bias voltage VD3 (largest value) is hence chosen so that the output power Ps (A3) corresponding to the highest amplitude level A3 takes the value of the saturation-onset output power, the added efficiency then being maximal. Likewise, the bias voltage VD2 is adapted so that the corresponding output power Ps (A2) is situated at the saturation onset point, the added efficiency for this bias voltage VD being at its maximum. Further, the same is done for the voltage VD1, for which the output power Ps (A1) of the lowest amplitude level is situated at the saturation limit value, the added efficiency again being at its maximum value.

These various values VD1, VD2, VD3 can be obtained either from a single voltage converter having one primary winding and several secondary windings that deliver the various values VD1, VD2, VD3, or, preferably, from three separate converters that supply the three values VD1, VD2, VD3 from the voltage source 8. The switch means 10 comprise a switch circuit 12 receiving the various voltage values VD1, VD2, VD3 coming from the converters 9, as well as the selection signal SS via an adaptation circuit 13 which makes it possible to switch-control three field-effect transistors 14 used as switches in the switch circuit 12. These three transistors 14 are MOSFET transistors receiving, on their source, the voltage coming from the converter 9 via a non-return diode 15. The adaptation circuit 13 receives the three digital signals B1, B2, B3 of the selection signal SS and comprises, for each of them, an amplifier 16 feeding the base of a bipolar transistor 17 whose emitter is grounded and whose collector is connected to the gate of the corresponding MOSFET transistor 14 and, via a resistor 18, between the source of the MOSFET transistor 14 and the diode 15. In this way, when the bit B1 is equal to 1, the corresponding switch transistor 14 is in the on-state and the switch circuit supplies the voltage VD1. Since the bits B2 and B3 are both equal to zero, the other two transistors 14 are in the off-state. Since the three drains of the transistors 14 are linked to a common output node 19, this node 19 receives only one of the bias voltages VD1, VD2, VD3, and does so as a function of the value of the bits B1, B2, B3 of the selection signal SS, said value itself being determined in order to be representative of the amplitude level A1, A2, A3 of the output modulated signals SMS. The switch means 10 therefore select, and apply to the node 19, the optimum level of drain bias voltage for the power transistor 6. Under these conditions, it will be understood that the added efficiency ηaj of the power transistor 6 is always optimal.

It should be noted that the switch means 10 and the converter means 9, as well as the logic-analysis circuit 11, are extremely simple circuits which do not carry the high-frequency signals at all.

The invention may be the subject of different variants in relation to the embodiment described above and represented in the figures. In particular, the gate bias voltage VG may also be driven, in a similar way, so that the output modulated signals SMS do not have their amplitude modified according to the variations in the drain bias voltage VD. This result may also be obtained, at least in part, by choosing an appropriate operation class of the power output transistor 6, for example class B.

Conversely, another option is for the modulator circuit 3 not to be an amplitude-modulator circuit, that is to say for it to carry out only phase modulation of the PSK type, so that the input modulated signals SME always have at least substantially the same amplitude level. The amplitude modulation may then be carried out through the amplification means 5 by choosing appropriate values of the various bias-voltage levels VD delivered to the node 19 for the power transistors 6. This is because the various drain bias-voltage levels vary as the digital control signals 1 and as the corresponding amplitude level for the output modulated signals SMS. In this case, the modulation means are therefore formed partly by the amplification means 5, and the analysis means 11 and switch means 10.

Furthermore, the invention is applicable to types of modulation other than 16-QAM, and in particular with modulation having a larger number of states (32-QAM, 64-QAM etc.).

In another variant, it is possible to provide a number of drain bias-voltage levels that is less than the number of amplitude levels of the output modulated signals, in particular when these various amplitude levels can be grouped by similar levels, or when it is accepted, for certain amplitude levels, that the drain bias voltage is not perfectly optimal. For example, it might be possible to use only a single bias-voltage level for several of the lowest amplitude levels (in particular when modulation having a large number of states is used).

The invention claimed is:

1. A transmitter of radio signals, referred to as output modulated signals (SMS), which are modulated at least in amplitude according to a discrete plurality of predetermined separate amplitude levels (A1, A2, A3), on the basis of digital control signals (1) comprising:
   modulation means (3) adapted to convert the digital control signals (1) into modulated signals, referred to as input modulated signals (SME);
   solid-state power amplification means (5) including at least one power transistor, at least one said at least one power transistor being an output power transistor (6) delivering output modulated signals (SMS);
   bias means (7) including at least one voltage source, and adapted to bias each power transistor of the amplification means (5), wherein the bias means (7) are adapted to be able to deliver, for at least one terminal to be biased in each output power transistor (6) of the amplification means (5), a predetermined discrete plurality of separate bias-voltage levels (VD1, VD2, VD3), each bias-voltage level being associated with and adapted to at least one of said amplitude levels (A1, A2, A3) of the output modulated signals (SMS);
   analysis means (11), adapted to generate in real time, on the basis of the instantaneous value of the digital control signals (1), a signal, referred to as a selection signal (SS), whose instantaneous value is representative of the instantaneous amplitude level needing to be taken by the output modulated signals (SMS) to be transmitted corresponding to this instantaneous value of the digital control signals (1), the instantaneous value of the selection signal (SS) varying with the digital control signals (1) according to a discrete plurality of values corresponding to the various amplitude levels (A1, A2, A3) of the output modulated signals (SMS); and
   switch means (10) receiving the selection signal (SS), and adapted to select and apply at each instant, to said terminal to be biased, a bias voltage that is delivered by the bias means (7) and whose value is equal to one of the bias-voltage levels, the selected bias-voltage level being associated with and adapted to the amplitude level represented by the instantaneous value of the selection signal (SS).

2. A transmitter of radio signals, referred to as output modulated signals (SMS), which are modulated at least in amplitude according to a discrete plurality of predetermined separate amplitude levels (A1, A2, A3), on the basis of digital control signals (1) comprising:
   modulation means (3) adapted to convert the digital control signals (1) into modulated signals, referred to as input modulated signals (SME);
   solid-state power amplification means (5) including at least one power transistor, at least one said at least one power transistor being an output power transistor (6) delivering output modulated signals (SMS);
   bias means (7) including at least one voltage source, and adapted to bias each power transistor of the amplification means (5), wherein the bias means (7) are adapted to be able to deliver, for at least one terminal to be biased in each output power transistor (6) of the amplification means (5), a predetermined discrete plurality of separate bias-voltage levels (VD1, VD2, VD3), each bias-voltage level being associated with and adapted to at least one of said amplitude levels (A1, A2, A3) of the output modulated signals (SMS);
   analysis means (11), adapted to generate in real time, on the basis of the instantaneous value of the digital control signals (1), a signal, referred to as a selection signal (SS), whose instantaneous value is representative of the instantaneous amplitude level needing to be taken by the output modulated signals (SMS) to be transmitted corresponding to this instantaneous value of the digital control signals (1), the instantaneous value of the selection signal (SS) varying with the digital control signals (1) according to a discrete plurality of values corresponding to the various amplitude levels (A1, A2, A3) of the output modulated signals (SMS); and switch means (10) receiving the selection signal (SS), and adapted to select and apply at each instant, to said terminal to be biased, a bias voltage that is delivered by the bias means (7) and whose value is equal to one of the bias-voltage levels, the selected bias-voltage level being associated with and adapted to the amplitude level represented by the instantaneous value of the selection signal (SS), wherein the analysis means (11) are formed by an electronic logic circuit (11) adapted to determine said instantaneous amplitude level, on the basis of the instantaneous digital value of the digital control signals (1), and to generate the selection signal (SS) representative of this instantaneous amplitude level.

3. The transmitter as claimed in claim 1, comprising a modulation circuit (3) adapted to convert the digital control signals (1) into analog signals that are modulated, at least in amplitude, according to a discrete plurality of predetermined separate amplitude levels, wherein the analysis means (11) are adapted to generate and deliver, on the basis of the digital control signals (1), a selection signal (SS) whose instantaneous value is representative of an instantaneous amplitude level of the signals delivered by the modulation circuit (3).

4. The transmitter as claimed in claim 1, wherein the modulation means (3) are means for quadrature amplitude modulation M-QAM with M states, M being a power of 2.

5. The transmitter as claimed in claim 1, wherein said discrete plurality of bias-voltage levels comprises an integer number N>1 of bias-voltage levels (VD1, VD2, VD3) equal to the number of amplitude levels (A1, A2, A3) of said discrete plurality of amplitude levels of the output modulated signals (SMS), each bias-voltage level being associated with and adapted to one and only one amplitude level.

6. The transmitter as claimed in claim 1, wherein each bias-voltage level is adapted so that the efficiency of each output power transistor (6), biased with this bias-voltage level, is optimal for the amplitude level of the output modulated signals (SMS) that it delivers.

7. The transmitter as claimed in claim 1, wherein each bias-voltage level is adapted so that each output power transistor (6), biased with said each bias-voltage level, delivers an output power (Ps) which is of the order of its saturation-onset power for the level of the output modulated signals (SMS) that it delivers.

8. The transmitter as claimed in claim 1, wherein each output power transistor (6) of the amplification means (5) is a field-effect transistor receiving input modulated signals (SME) on its gate and delivering the output modulated signals (SMS) on its drain, wherein the bias means (7) are adapted to be able to deliver a discrete plurality of drain bias-voltage levels VD, and wherein the switch means (10) are adapted to drive the value of the drain bias voltage VD of each output power transistor (6) according to the value of the selection signal (SS).

9. The transmitter as claimed in claim 1, wherein each output power transistor (6) of the amplification means (5) is a field-effect transistor receiving input modulated signals (SME) on its gate and delivering the output modulated signals (SMS) on its drain, wherein the bias means (7) are adapted to be able to deliver a discrete plurality of gate bias-voltage levels VG, and wherein the switch means (10) are adapted to drive the value of the gate bias voltage VG of each output power transistor (6) according to the value of the selection signal (SS).

10. The transmitter as claimed in claim 1, which is adapted for the transmission of signals that have a carrier in the microwave range and are capable of transmitting digital data with a rate of between 1 Mbit/s and 100 Mbit/s.

11. A transmitter of radio signals, referred to as output modulated signals (SMS), which are modulated at least in amplitude, on the basis of digital control signals comprising:

modulation means adapted to convert the digital control signals into modulated signals, referred to as input modulated signals (SME);

solid-state power amplification means including at least one power transistor, at least one said at least one power transistor being an output power transistor delivering output modulated signals (SMS);

bias means including at least one voltage source, and adapted to bias each power transistor of the amplification means, wherein the bias means are adapted to be able to deliver, for at least one terminal to be biased in each output power transistor of the amplification means, a predetermined discrete plurality of separate bias-voltage levels (VD1, VD2, VD3), each bias-voltage level being associated with and adapted to at least one amplitude level of the output modulated signals (SMS);

analysis means, adapted to generate in real time, a signal, referred to as a selection signal (SS), whose instantaneous value is representative of the instantaneous amplitude level needing to be taken by the output modulated signals (SMS) to be transmitted; and switch means receiving the selection signal (SS), and adapted to select and apply at each instant, to said terminal to be biased, a bias voltage that is delivered by the bias means and whose value is equal to one of the bias-voltage levels, this selected bias-voltage level being associated with and adapted to the amplitude level represented by the instantaneous value of the selection signal (SS).

12. The transmitter as claimed in claim 11, wherein the analysis means (11) are formed by an electronic logic circuit (11) adapted to determine said instantaneous amplitude level, on the basis of the instantaneous digital value of the digital control signals (1), and to generate the selection signal (SS) representative of this instantaneous amplitude level.

13. The transmitter as claimed in claim 11, wherein the modulation means (3) are means for quadrature amplitude modulation M-QAM with M states, M being a power of 2.

14. The transmitter as claimed in claim 11, wherein said discrete plurality of bias-voltage levels comprises an integer number N>1 of bias-voltage levels (VD1, VD2, VD3) equal to the number of amplitude levels (A1, A2, A3) of said discrete plurality of amplitude levels of the output modulated signals (SMS), each bias-voltage level being associated with and adapted to one and only one amplitude level.

15. The transmitter as claimed in claim 11, wherein each bias-voltage level is adapted so that the efficiency of each output power transistor (6), biased with said each bias-voltage level, is optimal for the amplitude level of the output modulated signals (SMS) that it delivers.

16. The transmitter as claimed in claim 11, wherein each bias-voltage level is adapted so that each output power transistor (6), biased with this bias-voltage level, delivers an output power (Ps) which is of the order of its saturation-onset power for the level of the output modulated signals (SMS) that it delivers.

17. The transmitter as claimed in claim 11, wherein each output power transistor (6) of the amplification means (5) is a field-effect transistor receiving input modulated signals (SME) on its gate and delivering the output modulated signals (SMS) on its drain, wherein the bias means (7) are adapted to be able to deliver a discrete plurality of drain bias-voltage levels VD, and wherein the switch means (10) are adapted to drive the value of the drain bias voltage VD of each output power transistor (6) according to the value of the selection signal (SS).

18. The transmitter as claimed in claim 11, wherein each output power transistor (6) of the amplification means (5) is a field-effect transistor receiving input modulated signals (SME) on its gate and delivering the output modulated signals (SMS) on its drain, wherein the bias means (7) are adapted to be able to deliver a discrete plurality of gate bias-voltage levels VG, and wherein the switch means (10) are adapted to drive the value of the gate bias voltage VG of each output power transistor (6) according to the value of the selection signal (SS).

19. The transmitter as claimed in claim 11, which is adapted for the transmission of signals that have a carrier in the microwave range and are capable of transmitting digital data with a rate of between 1 Mbit/s and 100 Mbit/s.

* * * * *